(12) United States Patent
Grek

(10) Patent No.: US 6,719,574 B2
(45) Date of Patent: Apr. 13, 2004

(54) ANGLED ELECTRICAL CONNECTOR

(75) Inventor: Joachim Grek, Katrineholm (SE)

(73) Assignee: FCI, Paris (FR)

( * ) Notice: Subject to any disclaimer, the term of this patent is extended or adjusted under 35 U.S.C. 154(b) by 0 days.

(21) Appl. No.: 10/148,649

(22) PCT Filed: Dec. 1, 2000

(86) PCT No.: PCT/SE00/02407
§ 371 (c)(1),
(2), (4) Date: Oct. 7, 2002

(87) PCT Pub. No.: WO01/39583
PCT Pub. Date: Jun. 7, 2001

(65) Prior Publication Data
US 2003/0054678 A1 Mar. 20, 2003

(30) Foreign Application Priority Data
Dec. 1, 1999 (SE) ................................. 9904358

(51) Int. Cl.[7] ................................. H01R 9/09
(52) U.S. Cl. ................................. 439/79
(58) Field of Search ................... 439/67, 79, 80, 439/931

(56) References Cited

U.S. PATENT DOCUMENTS

| 4,600,256 A | * | 7/1986 | Anttila | 439/65 |
| 4,861,272 A | * | 8/1989 | Clark | 439/79 |
| 5,088,009 A | * | 2/1992 | Harada et al. | 361/787 |
| 5,203,075 A | * | 4/1993 | Angulas et al. | 29/830 |
| 5,252,080 A |   | 10/1993 | Pesson | 439/79 |
| 5,354,207 A | * | 10/1994 | Chikano | 439/79 |
| 5,453,016 A | * | 9/1995 | Clark et al. | 439/79 |
| 5,605,477 A | * | 2/1997 | Wu et al. | 439/620 |
| 5,639,249 A |   | 6/1997 | Lenoir | 439/79 |
| 6,174,198 B1 | * | 1/2001 | Wu et al. | 439/541.5 |
| 6,200,146 B1 | * | 3/2001 | Sarkissian | 439/79 |
| 6,280,205 B1 | * | 8/2001 | Murowaki et al. | 439/79 |

FOREIGN PATENT DOCUMENTS

| JP | 2-112184 | * | 4/1990 |
| WO | WO 97/13299 |   | 4/1997 |
| WO | WO 97/42686 |   | 11/1997 |

* cited by examiner

Primary Examiner—Tulsidas Patel
Assistant Examiner—Phuong K Dinh
(74) Attorney, Agent, or Firm—Perman & Green, LLP

(57) ABSTRACT

An angled connector and a method for mounting the same, having first connector means (20) extended in a first direction and second connector means (29a–c) extended in an angled direction in relation to the first connector means (20). According to the invention the slanted connector comprises a first part (2) comprising the first connector means (20) and a second part (21a–e) comprising the second connector means (29a–c) The second part (21a–e) is connectable to the first connector means (20) and has a bent form in order to engage the first connector means (20) in a first direction and provide the second connector means (29a–c) protruding in at least one second direction angled to the first direction, the second part (21a–e) having a circuit pattern to connect the first connector means (20) to the second connector means (29a–c).

28 Claims, 5 Drawing Sheets

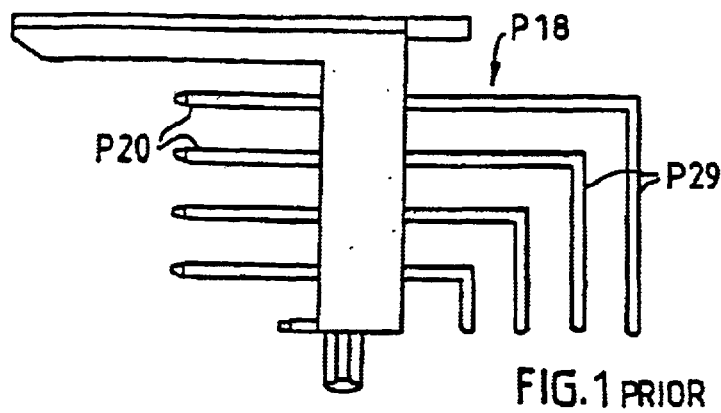
FIG. 1 PRIOR ART
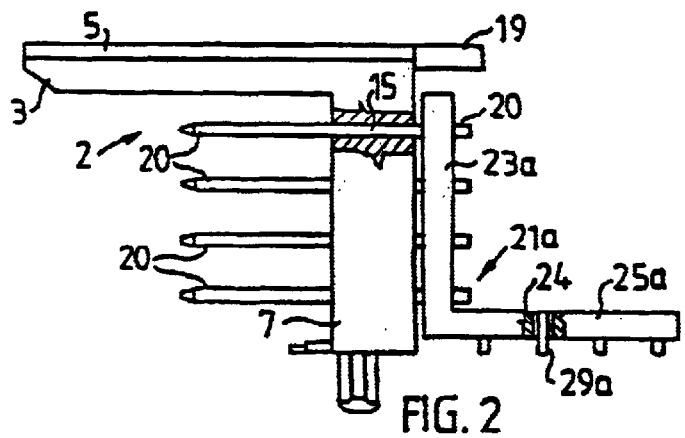
FIG. 2
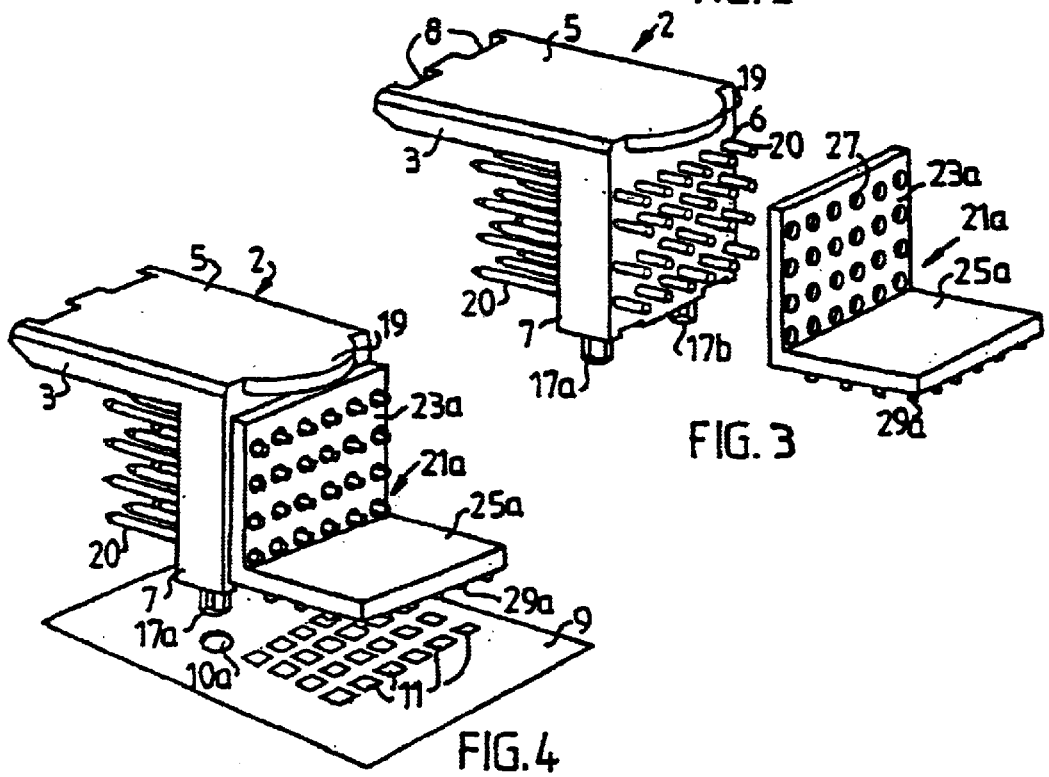
FIG. 3
FIG. 4

ANGLED ELECTRICAL CONNECTOR

This application claims the benefit of the earlier filed International Application No. PCT/SE00/02407, International Filing Date, Dec. 1, 2000, which designated the United States of America, and which international application was published under PCT Article 21(2) in English as WO Publication No. WO 01/39583 A1.

TECHNICAL FIELD

The present invention relates to a slanted connector having first connector means extended in a first direction and second connector means extended in a slanted direction in relation to the first connector means.

It also relates to a method for mounting a slanted connector having first connector means extended in a first direction and second connector means extended in a slanted direction in relation to the first connector means.

RELATED ART

In electrical connections and circuits there are sometimes a need for slanted connectors. There are such connectors available today and an example of the construction of such a connector is shown in FIG. 1. This connector comprises contact pins P18, which are slanted a certain angle. This angle is most often 90°. The bent divides the contact pins P18 into first connector means P20 and second connector means P29. This kind of connectors is very often provided at printed circuits. The second connector means P29 are soldered to a circuit card. In this example the pins forms a four times six matrix. As can be seen from the figure the pins in each row are of different lengths.

U.S. Pat. No. 5,252,080 describes a press-fit printed circuit board connector, which comprises an insulative body in two parts and a series of right-angle metal pins. The structure of the connector is such that the connector does not require any dedicated tooling for mounting it on a board.

SUMMARY

One of the problems with these today available slanted connectors is that the production process requires many different tools and working moments since different bending tools are needed for bending the pins with different lengths. The bending of the pins could also result in cracks in the pins. Another problem is that the different lengths of the pins result in a time shift of the signals to be transferred due to the resistance in the pins. Yet another problem is that the end positions of the slanted pins to be connected to a printed circuit board not are precise. The different lengths of the pins cause an uncertainty in the position of the ends of the pins. This uncertainty makes it hard to perform surface mounting of the connector.

One object of the present invention is to simplify the mounting process of a slanted processor.

Another object of the present invention is to improve the true positions of the pins of a slanted connector to be connected to a printed circuit board.

Yet another object is to get rid of the time shift of the signals to be transferred.

The above mentioned objects have been achieved by a slanted connector of the initially defined kind, which is characterised by
 a first part comprising the first connector means;
 a second part comprising the second connector means and being connectable to the first connector means, the second part having a bent form in order to engage the first connector means in a first direction and provide the second connector means protruding in at least one second direction slanted to the first direction, the second part having a circuit pattern to connect the first connector means to the second connector means.

This slanted connector is much easier and faster to produce than the ones used today since the connector means does not need to be bent. Therefor also the exactness in the positions of the second connector means is improved and the risk for cracks in the pins is eliminated.

The objects have also been achieved by a method of the initially defined kind, which is characterised by the following steps:
 creating a first part of the connector comprising the first connector means;
 creating a separate second part of the connector comprising the second connector means, the second part having a bent form and receiving means for receiving the first connector means along the first direction and having the second connector means protruding in at least one wanted slanted direction, the second part connecting electrically the receiving means with the second connector means;
 mounting the second part on the first part by connecting the first connector means to the receiving means;
 placing the second connector means on a printed circuit board and soldering the connector to the printed circuit board.

This method for mounting does not include any bending of the connector means and therefor the mounting is quick and easy and the end positions of the second connector means will be more exact than in today existing slanted connectors.

Preferably the second part is a bent printed circuit board having the circuit pattern as a printed pattern.

Suitably the second connector means are adapted to be connected to a printed circuit board.

The second part comprises advantageously two plates, one first plate and one second plate, integrally connected and angled to each other.

Preferably the first plate is provided with through holes for the first connector means to fit into.

The second plate could be provided with through holes for the second connector means to fit into. Otherwise the second connector means could be integrally connected to the second plate, the second connector means being covered with a conducting cover.

Suitable the angle between the first plate and the second plate is a right angle, this implying that the angle between the first connector means and the second connector means is right.

The second part could preferably comprise conductors, each conductor connecting at least one of the first connector means to at least one of the second connector means.

Suitably all the conductors have the same length because if the conductors have the same length there is no problem with the time shift of the signals to be transferred as mentioned above.

The second part could be built up as a multilayer printed wiring board, having more than one layer, each layer containing at least one of the conductors.

Preferably the first part comprises a frame to receive the first connector means in supporting through holes providing a firm grip around each first connector means to keep them in a fixed relationship to each other, each connector means protruding from the frame a distance long enough to make electrical contact with through holes in the second part, when the first and second parts are mounted to each other.

The frame comprises suitably at least one guiding pin protruding from the connector in the same direction as the second connector means but a greater distance. This at least one guiding pin guides the connector to the right position when mounted on a circuit board.

The frame could comprise a cap for a robot to grab for automatic mounting of the connector on the circuit board.

Preferably the frame and the second part, besides the conductors are made of an insulating material.

The number of first connector means and the number of second connector means is preferably the same. This implies that one first connector means corresponds to one second connector means.

A component could be provided on the second part, the component being connected to one or more of the conductors. The component could for example be a delay unit, which controls the transferring time of the signals.

The second plate can comprise two plates integrally connected and angled to each other, this implying that the outgoing pins are protruding in two different directions.

The angle between the first plate and the second plate could differ from 90°.

BRIEF DESCRIPTION OF THE DRAWINGS

FIG. 1 shows a side view of a prior art connector.

FIG. 2 shows a side view of a first embodiment of the connector according to the invention FIG. 3 shows a perspective view of the same connector as in FIG. 2 in a separated position.

FIG. 4 shows a perspective view of the same connector as in FIGS. 2 and 3 in a mounted position and also to be mounted on a printed circuit board.

DETAILED DESCRIPTION OF THE DRAWINGS

Figure 5:
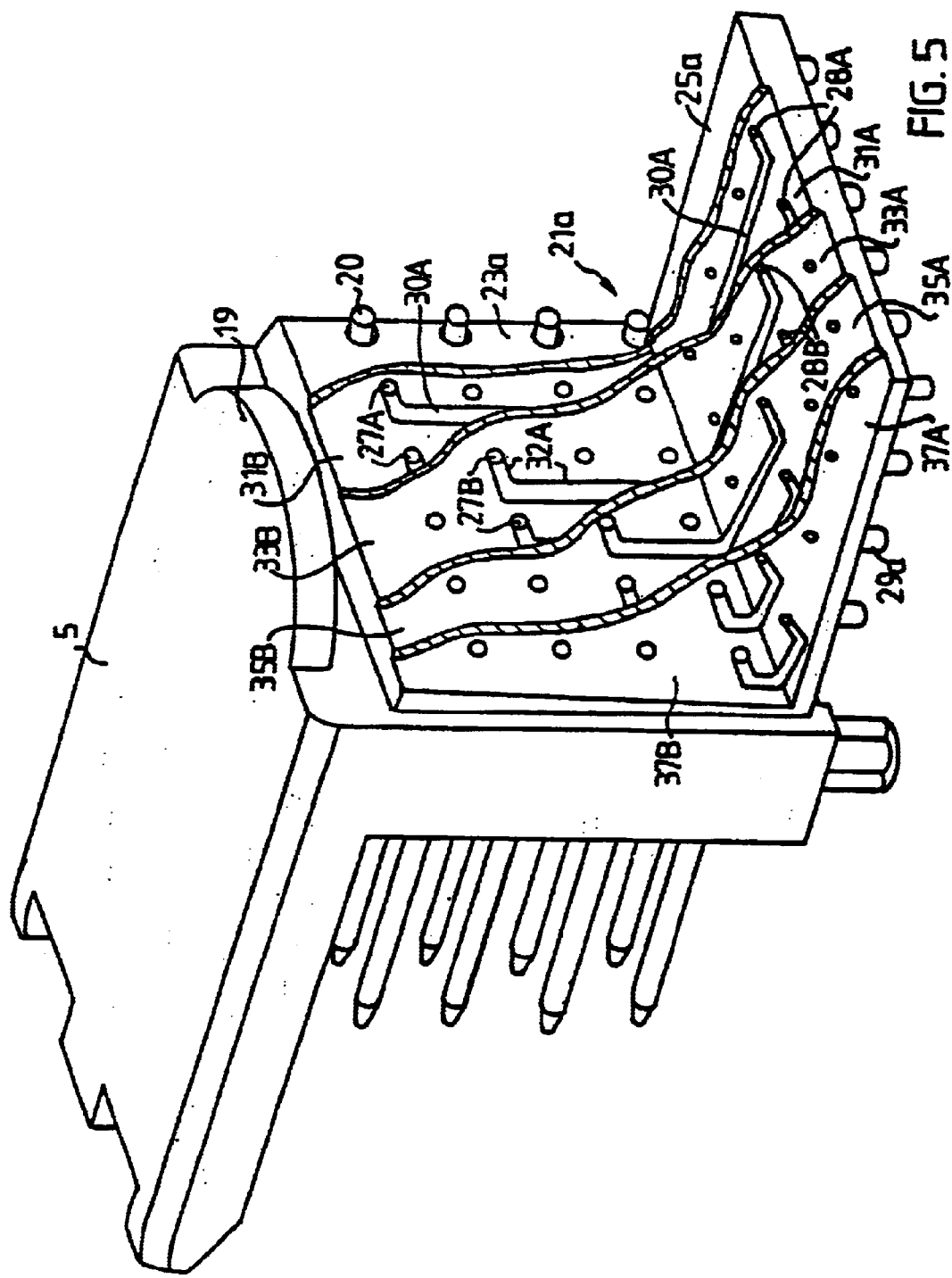
FIG. 5 shows the same connector as in FIG. 3 but having the slanted part partly in sections to show the different layers having the connecting strips.

FIGS. 2, 3 and 4 shows a first embodiment of a slanted connector according to the invention and represents the best mode of the invention. The connector comprises a first part 2 and a second part 21a. The first part 2 comprises a frame 3 made of an insulating material and, in this example, twenty-four incoming pins 20 as the first kind of connector means. The frame 3 comprises two plates 5 and 7 being integrally connected to each other so that they have an angle in relation to each other. In the shown embodiment they are mounted at right angles to each other, but the angle could be varied. The incoming pins 20 are in this embodiment all of the same length, but it is common that for instance six of the pins 20 are longer than the rest. The pins 20 are mounted in through holes 15 in the plate 7. The size of the through holes 15 is adapted to the size of the pins 20. The holes 15 are preferably provided with some kind of gripping arrangement so that the pins 20 are fixedly positioned. The plate 7 has also a certain thickness in order to support and grip the pins 20 firmly in their positions.

The connector is intended to be mounted on a printed circuit board 9 and is therefor provided, at the end of the plate 7 opposite to the plate 5, with two guiding pins 17a and 17b adapted to be placed in guiding openings in the board 9, one of the guiding openings 10a being visible in FIG. 4. The guiding pins 17a, 17b protrude in the direction of the plate 7 and are positioned along a line perpendicular to the incoming pins 20. The number of guiding pins could of course be varied.

The plate 5 is thinner than the plate 7 and has the purpose to shield the pins 20 against mechanical damage. Thus the plate 5 is placed parallel to the pins 20 and has a longer extension than the pins 20 in their incoming direction. The end of the plate 5, which is connected to the plate 7 is provided with a cap 19 for a robot to grab when the connector is automatically surface mounted on the printed circuit board 9. The cap 19 is here shown to be shaped like a section of a circle but could of course have other shapes adapted to be grabbed by a robot. Also the other side of the plate 5 has some cuts 8 provided near to grooves (not shown) for guiding a connecting part into the connector as common in the art.

The second part 21 comprises two plates 23a and 25a being integrally, mechanically connected and angled to each other, the angle deciding how much the connector is slanted. In the shown embodiment the angle between the plates 23a, 25a is a right angle, but the angle could be varied.

The plate 23a is intended to be connected to the incoming pins 20 protruding out from the plate 7 of the first part 2. It has hence receiving means, which in the shown embodiment is a through hole 27 per pin 20 positioned to receive each pin 20 individually. Each hole 27 has electrically leading sides, which could be an electrically leading lining or the like making electrical contact with the pin 20. Each hole 27 has also a size just adapted to the size of the pin 20 in order to have a good grip together with good electrical contact. This is provided when the second part 21a is mounted on the first part 2, as shown in FIG. 4. In order to make a press fit for good electrical contact the incoming pins 20 could be shaped like the letter H at their ends protruding from the plate 7.

The plate 25a is provided with a second kind of connector means here called outgoing pins 29a on the side of the plate 25a turned towards the printed circuit board 9. The number of the outgoing pins 29a is in this embodiment the same as the number of the incoming pins 20, but the numbers could differ. Each of the pins 29a is in this embodiment connected with an individual of the incoming pins 20. The pins 29a could be provided in the same matrix combination as the incoming pins 20 and they are in this embodiment each mounted, for example soldered, in a metallized through hole 24 (FIG. 2) for electrical connection. When the connector is mounted the outgoing pins 29a from the plate 25a are preferably pointing in the same direction as the guiding pins 17a, 17b on the plate 7. However the guiding pins 17a, 17b are most often longer than the outgoing pins 29a since they are to be positioned in the guiding openings, of which one 10a is visible in FIG. 4, in the printed circuit board 9. The outgoing pins 29a could be adapted for wave soldering and should then rest on contact pads 11 on the circuit board 9 to which the pins 29a should be soldered. However the pins 29a could also be adapted to be inserted in holes in the board to be soldered therein, as in somewhat older techniques.

FIG. 5 shows the second part 21a of the first embodiment of the two parted slanted connector partly in cross section and in larger scale. Both the plates 23a and 25a are divided in four inner layers 31A, 33A, 35A, 37A and 31B, 33B, 35B, 37B respectively, i.e. one layer for each row of pins 20, 29a. Each layer in one of the plates 23a, 25a continues in the same layer in the other plate 23a, 25a, such that each layer is slanted. Each connection hole 27A in the first row of holes for the pins 20 nearest the plate 5 is connected to an individual pin 28A of the pins 29a in the outermost row of pins 29a in the plate 25a by a conductive printed connector 30A in the outermost layer 31A, 31B. Each connection hole 27B in the row next nearest to the plate 5 is connected to an individual pin 28B of the pins 29a in the next outermost row of pins 29a in the plate 25a by a conductive printed connector 32A in the next outermost layer 33A, 33B etc.

It is also possible that each connection hole 27A in the first row of holes for the pins 20 nearest the plate 5 is connected to an individual pin of the pins 29a in the innermost row of pins 29a in the plate 25a by a conductive printed connector in the outermost layer 31A, 31B. To make all the connectors equal in length each connection hole 27B in the row next nearest to the plate 5 is connected to an individual pin of the pins 29a in the next innermost row of pins 29a in the plate 25a by a conductive printed connector in the next outermost layer 33A, 33B etc. When all the connectors have the same length there will be no problem with the time shift as in the old technique.

The second part 21a is thus a multilayer printed board, which is bent and has through holes 27, 24 through all the layers 31A, 33A, 35A, 37A and 31B, 33B, 35B, 37B. However the outermost surface layer of the plate 25a is a shielding layer hiding the through holes 24 and providing an attractive design of the second part 21a.

Figure 6:
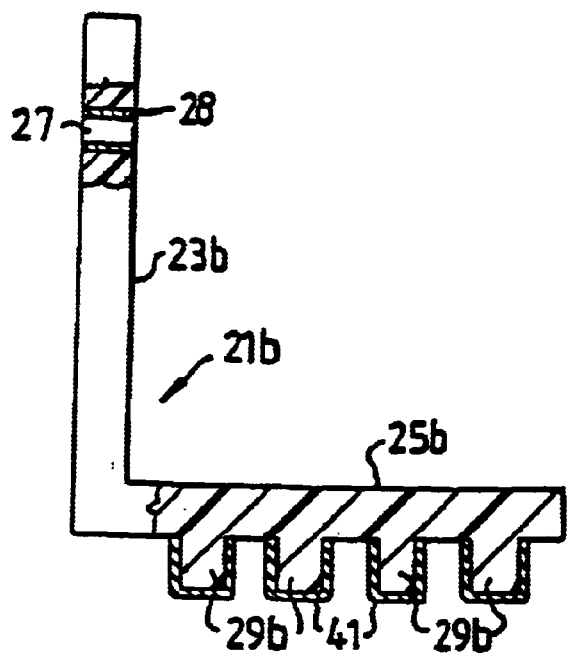
FIG. 6 shows a second embodiment of the connector according to the invention in a side view cross section.

FIG. 6 shows a second embodiment of the connector according to the invention in a side view partly in cross section. It shows only a second part 21b, since the rest of the connector is the same as in the first embodiment. The second part 21b comprises, as in the first embodiment two plates, 23b and 25b, which are integrally, mechanically connected to each other. In this shown embodiment the angle between the plates 23b, 25b is a right angle, but it could be varied.

The plate 25b comprises outgoing pins 29b, which are integrally connected to the plate 25b and thus made of the same material, which is an insulating material. The outgoing pins 29b are provided with a conductive cover 41 for making electrical contact to the printed circuit board 9 when the connector is mounted on the printed circuit board 9. The plate 23b is provided with holes 27 each having a metal lining 28 as in the first embodiment.

Figure 7:
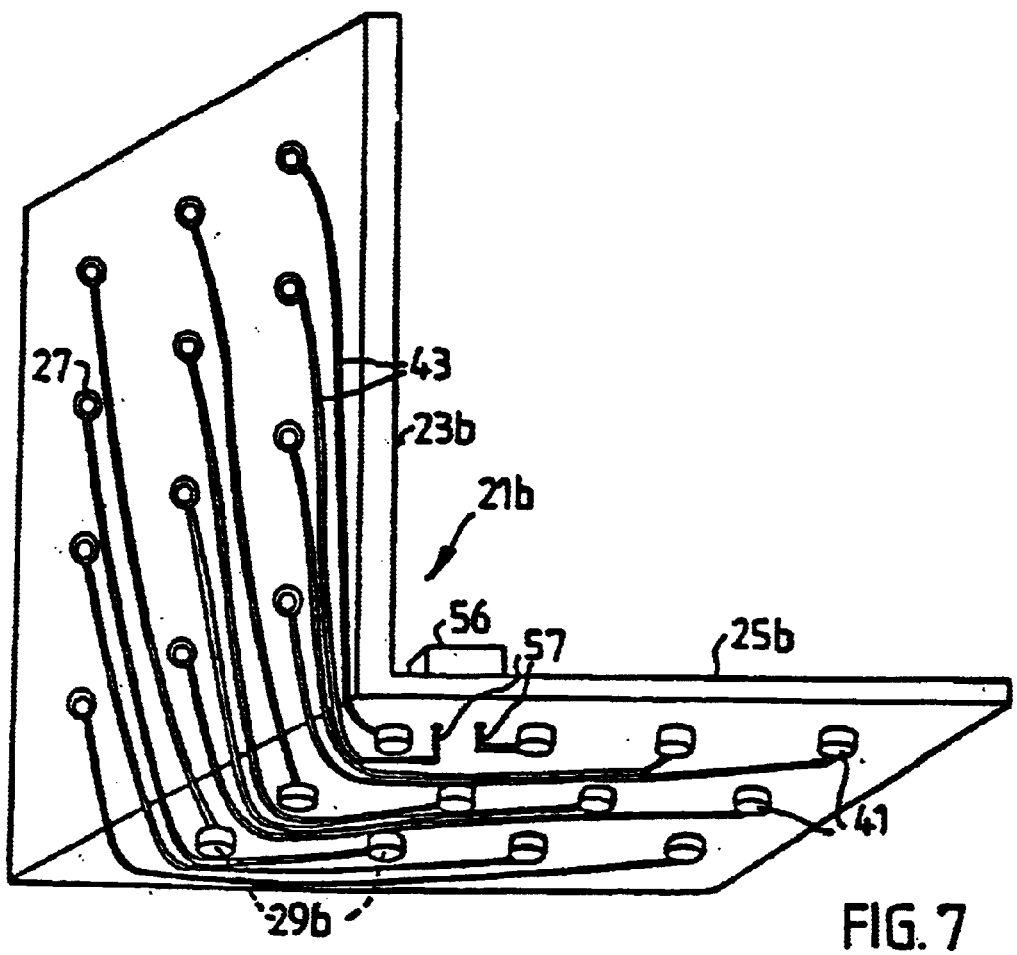
FIG. 7 shows the same connector as in FIG. 6 in a perspective view from the backside.

FIG. 7 shows the same connector as in FIG. 6 in a perspective view. The view is from the backside and there it could be seen that in this embodiment each hole 27 is connected to an individual pin 29b by a conductor 43 provided at a one layer printed circuit board. The number of the outgoing pins 29b and the holes 27 could be twenty-four as in the first embodiment, but for simplicity sake the number shown in the figure is twelve. The number could even in this embodiment be different for the outgoing pins 29b and the holes 27 this implying that either each hole 27 could be connected to a plurality of pins 29b or each pin 29b could be connected to a plurality of holes 27.

The manufacturing of this slanted connector shown in FIGS. 6 and 7 starts with the casting of the plates 23b, 25b and the outgoing pins 29b from an insulating material. The plates 23b, 25b and the outgoing pins 29b are thus all integrally connected. Then the plates 23b, 25b and the pins 29b are covered with a metal cover. The metal is then taken away just to leave metal in the holes 27, on the pins 29b and as conductors between the holes 27 and the pins 29b. The conductors are made equal in length to avoid the time shift problem occurring from the greater resistance for the signals to be transferred in a long conductor than in a short conductor. In this embodiment the conductors are made equal in length by connecting suitable holes 27 to each pin 29b such that the distance between the connected holes 27 and pins 29b always is the same. Another method is to let the conductors wind when the distance is short between the hole 27 and the pin 29b to be connected.

In FIG. 7 it is also shown that a component 56, for example a delay unit could be integrated on the second part 21b. The component 56 is thus connected to one or more of the conductors 43 by connecting pins 57. This kind of component could also be provided in all the other embodiments. It is also possible to let the second part 21b operate as a bent printed board provided with a plurality of components making a suitable signal processing of the signals from the incoming pins 20 before they are fed to the outgoing pins 29b connected to the circuit board 9.

Figure 8A:
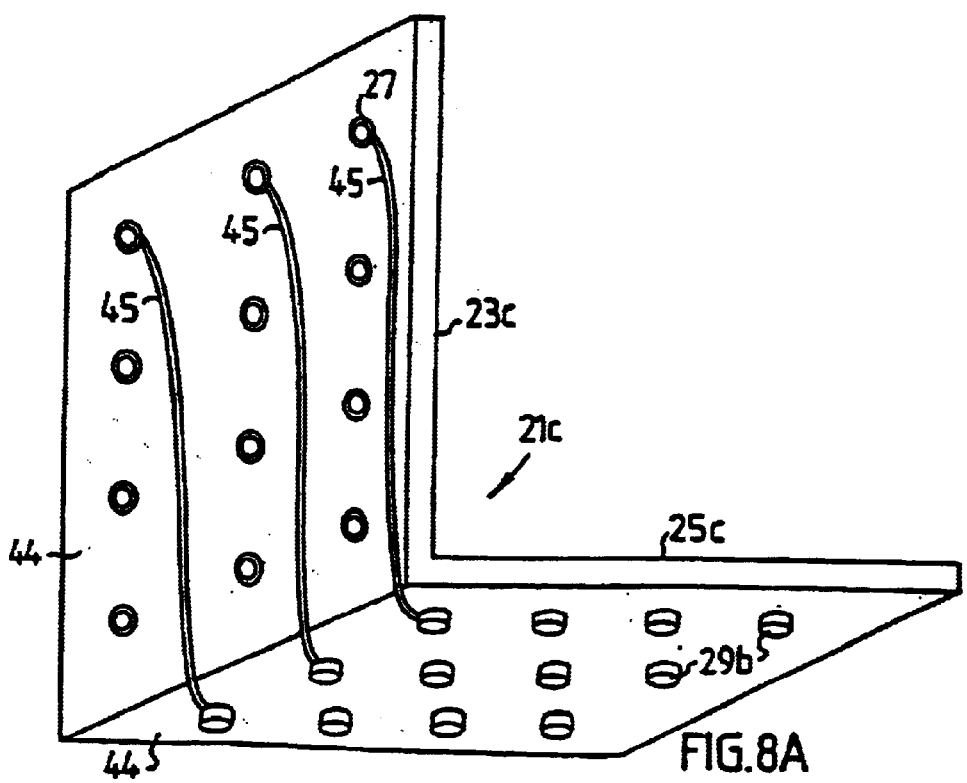
FIGS. 8a and b show a third embodiment of the connector according to the invention in a perspective view from different layers.

FIGS. 8a and b show a third embodiment of the connector according to the invention in a perspective view from different layers. In this embodiment a second part 21c of the connector is built up of four different conductor layers as in the first embodiment The profile of this embodiment when only one layer is disposed looks like the profile in FIG. 6. The second part 21c comprises like the second embodiment two plates 23c and 25c integrally, mechanically connected to each other. In this shown embodiment the angle between the plates 23c, 25c is a right angle, but it could be varied.

The plate 25c comprises outgoing pins 29b, which are integrally connected to the plate 25c and thus made of the same material, which is an insulating material. The outgoing pins 29b are provided with a metallic cover for making electrical contact to the printed circuit board 9 when the connector is mounted on it. The plate 23c is provided with metallized holes 27 as in the first embodiment. As in the second embodiment only twelve holes 27 and pins 29b are shown. The number of holes 27 and pins 29b could be varied.

FIG. 8a shows an inner layer 44 of the second part 21c. This layer 44 is similar to the second embodiment but in this embodiment the layer 44 comprises conductors 45 connecting only the holes 27 in the first row of holes for the pins 20 nearest the plate 5 with the pins 29b in the innermost row on the plate 25c.

Figure 8B:
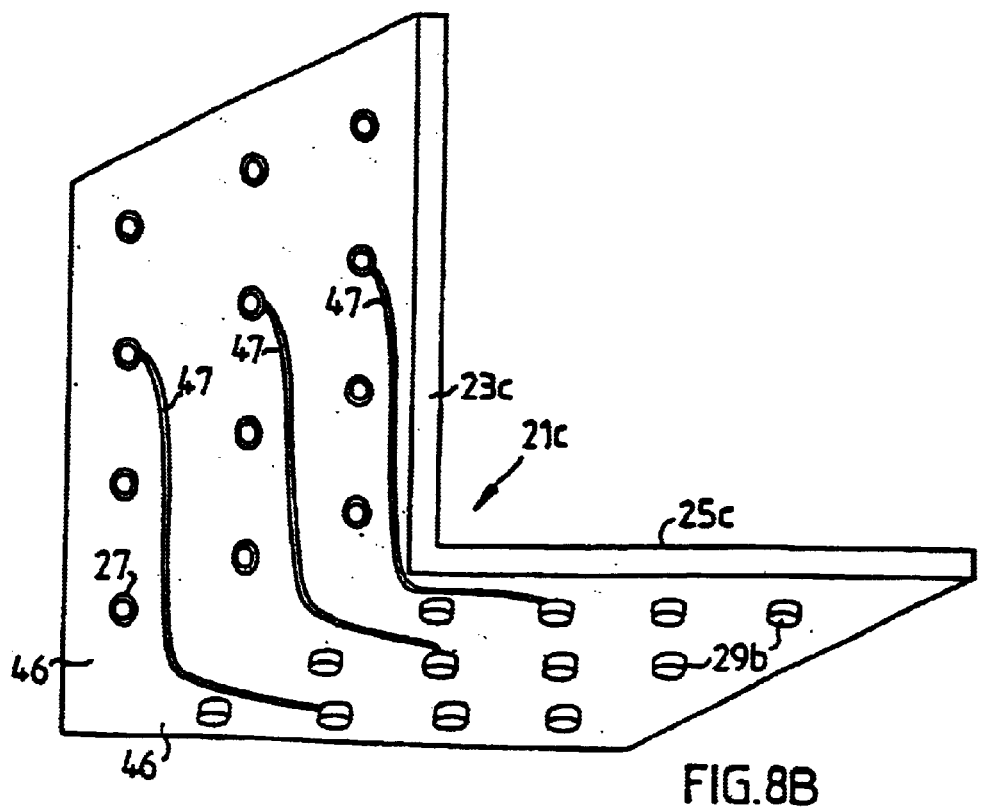

FIG. 8b shows a second layer 46 in the second part 21c. Between this second layer 46 and the first layer 44 an insulating layer has been disposed. The second layer 46 comprises in this embodiment conductors 47 from each individual of the holes 27 in the row second nearest to the plate 5 to each individual of the pins 29b in the row next innermost on the plate 25c.

In the third layer the third row of holes is connected to the third row of pins and so on.

Figure 9:
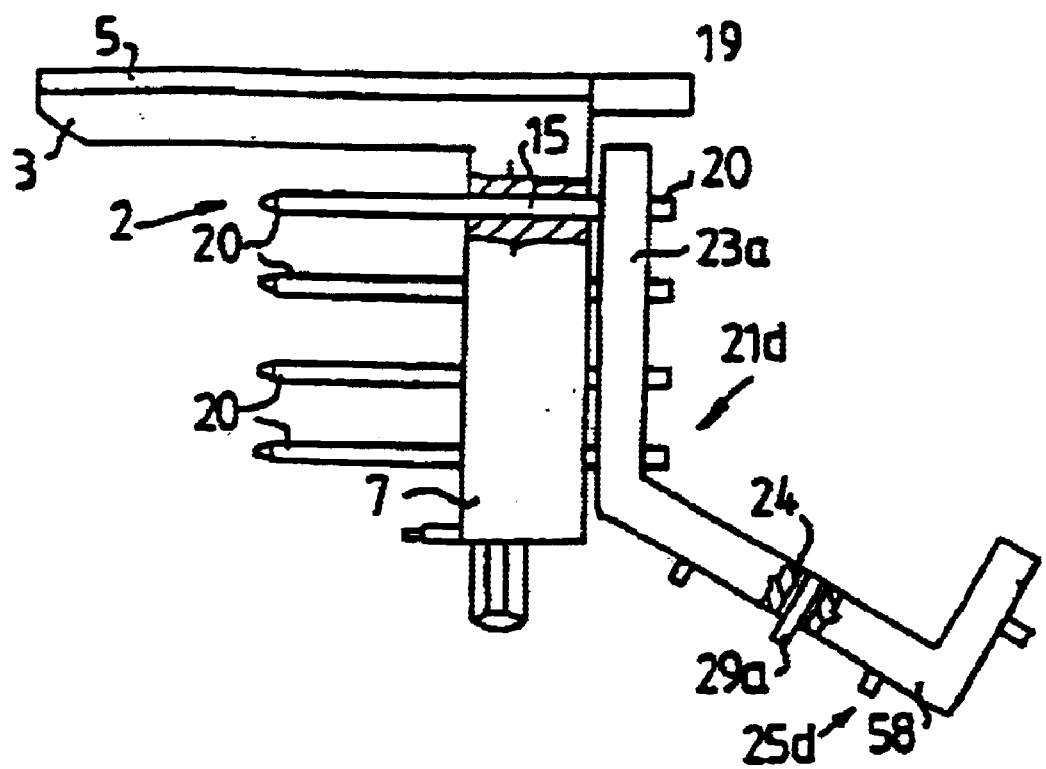
FIG. 9 shows a side view of a fourth embodiment of the connector according to the invention.

FIG. 9 shows a side view of a fourth embodiment of the connector according to the invention. Only a second part 21d of the connector is shown since the first part 2 is the same as in the previous described embodiments. The second part comprises, as in the other embodiments, two plates 23a, 25d which are integrally connected and angled to each other. The angle between the plates 23a, 25d is here shown to be bigger than 90°. The angle could however be varied. Besides the angle, the only difference from the previous described embodiments is that the second plate 25d is divided into two plates 58, 59 integrally connected and angled to each other. In this shown embodiment the angle is right but it could be varied. Here it is shown that one of the four rows of the outgoing pins 29a is connected to the plate 59 and thus protruding in a different direction than the outgoing pins 29a in the other three rows. The number of the outgoing pins 29a connected to plate 58 and 59 respectively could be varied. This fourth embodiment could of course be implemented in all the other embodiments.

Although the invention is described with respect to five exemplary embodiments it should be understood that modifications could be made without departing from the scope thereof as expressed in the attached claims. Accordingly, the invention should not be considered to be limited to the described embodiments, but defined only by the following claims, which are intended to embrace all equivalents thereof.

What is claimed is:

1. An angled connector having a housing with first connector means (20) extended in a first direction and second connector means (29a–c) extended in a angled direction in relation to the first connector means (20), characterised by
    a first part (2) comprising a first housing part and the first connector means (20);
    a second part (21a–e) comprising the second connector means (29a–c) and being connectable to the first connector means (20), the second part further comprising a second housing part that is a one piece member holding the second connector means, the second housing part having a bent form in order to engage the first connector means (20) in a first direction and provide the second connector means (29a–c) protruding in at least one second direction angled to the first direction, the second housing part having a circuit pattern to connect the first connector means (20) to the second connector means (29a–c).

2. An angled connector according to claim 1, characterised in that the second part (21a–d) is a bent printed circuit board having the circuit pattern as a printed pattern.

3. An angled connector according to claim 1, characterised in that the second connector means (29a–c) are adapted to be connected to a printed circuit board (9).

4. An angled connector according to claim 1, characterised in that the second housing part (21a–e) comprises two plates, one first plate (23a–d) and one second plate (25a–e), angled to each other.

5. An angled connector according to claim 4, characterised in that the first plate (23a–d) is provided with through holes (27) for the first connector means (20) to fit into.

6. An angled connector according to claim 4, characterised in that the second plate (25a, 25d, 25e) is provided with through holes (24) for the second connector means (29a, 25c) to fit into.

7. An angled connector according to claim 4, characterised in that the second plate (25b, 25c) is a one piece member with integral second connector means the second connector means (29b) being covered with a conducting cover (41).

8. An angled connector according to claim 4, characterised in that the angle between the first plate (23a–d) and the second plate (25a, 26b, 25c, 25e) is a right angle, and the angle between the first connector means (20) and the second connector means (29a–c) is right.

9. An angled connector according to claim 4, characterised in that the second plate (25a–d, 25e) comprises two plates (58, 59) integrally connected and angled to each other so that the outgoing pins (29a–c) are protruding in two different directions.

10. An angled connector according to claim 4, characterised in that the angle between the first plate (23a) and the second plate (25d) is not a right angle.

11. An angled connector according to claim 1, characterised in that the second housing part (21a–e) comprises conductors (30A, 32A, 43, 45, 47, 63), each conductor (30A, 32A, 43, 45, 47, 63) connecting at least one of the first connector means (20) to at least one of the second connector means (29a–c).

12. An angled connector according to claim 11, characterised in that all the conductors (43, 45, 47, 63) have the same length.

13. An angled connector according to claim 11, characterised in that the second housing part (21a, 21c) is built up as a multilayer printed circuit board, having more than one layer (31A, 31B, 33A, 33B, 35A, 35B, 37A, 37B, 44, 46), each layer containing at least one of the conductors (30A, 32A, 45, 47).

14. An angled connector according to claim 11, characterised in that a component (56) is provided on the second part (21a–e), the component being connected to one or more of the conductors 30A, 32A, 43, 45, 47).

15. An angled connector according to claim 1, characterised in that the first housing part (2) comprises a frame (3) to receive the first connector means (20) in supporting through holes (15) providing a firm grip around each first connector means (20) to keep them in a fixed relationship to each other, each connector means (20) protruding from the frame a distance long enough to make electrical contact with through holes (27) in the second housing part (21a–e), when the first and second parts (2,21a–e) are mounted to each other.

16. An angled connector according to claim 15, characterised in that the frame (3) comprises at least one guiding pin (17a, 17b) protruding from the connector in the same direction as the second connector means (29a–c) but a greater distance.

17. An angled connector according to claim 15, characterised in that the frame (3) comprises a cap (19) for a robot to grab for automatic mounting of the connector on a printed circuit board (9).

18. An angled connector according to claim 15, characterised in that the frame (3) and the second part (21a–e), besides the conductors (30A, 32A, 43, 45, 47) are made of an insulating material.

19. An angled connector according to claim 1, characterised in that the number of first connector means (20) and the number of second connector means (29a–c) is the same.

20. The angled connector according to claim 1 wherein the first and second housing parts are connected and wherein when the angled connector is mounted to a printed circuit board, the first housing part is mounted to the printed circuit board substantially simultaneously with the second connector means being connected to the printed circuit board.

21. A method for mounting an angled connector having a housing and first connector means (20) extended in a first direction and second connector means (29a–c) extended in a angled direction in relation to the first connector means (20), characterised by the following steps:
    creating a first part (2) of the connector comprising a first housing part and the first connector means (20);
    creating a separate second part (21a–e) of the connector comprising the second connector means (29a–c), the second part further comprising a second housing part that is a one piece member holding the second connector means, the second housing part (21a–e) having a bent form and receiving means (27) for receiving the first connector means (20) along the first direction and having the second connector means (29*a–c*) protruding in at least one slanted direction, the second housing part (21*a–e*) connecting electrically the receiving means (27) with the second connector means (29*a–c*);

mounting the second part (21*a–e*) on the first part (2) by connecting the first connector means (20) to the receiving means (27);

placing the second connector means (29*a–c*) on a printed circuit board (9) and soldering the connector to the printed circuit board (9).

22. A method according to claim 21, characterised in that the creating of the second part (21*b*, 21*c*) comprises casting the second connector means (29*b*) together with the second housing part (21*b*, 21*c*) in an insulating material and covering the second connector means (29*b*) with a conducting cover (41).

23. A method according to claim 21, characterised by providing at least one guiding pin (17*a*, 17*b*) on the first part (2), the guiding pin (17*a*, 17*b*) being adapted to be seated in at least one guiding opening (10*a*) when the second connector means (29*a–c*) are placed on a printed circuit board (9).

24. A method according to claim 21, characterised in that the electrical connecting of the receiving means (27) and the second connector means (29*a–c*) is provided by creating a bent, multilayer, printed board having electrical conductors (30A, 32A, 45, 47) in different layers (31A, 31B, 33A, 33B, 35A, 35B, 37A, 37B, 44, 46), the printed board defining the second housing part.

25. A method according to claim 24, characterised by connecting a component (56) to one or more of the conductors (30A, 32A, 43, 45, 47, 63) in the second part (21*b*).

26. A method according to claim 21, characterised by providing the receiving means (27) of the second part (21*a–e*) as through holes formed in the second housing part having electrically leading sides, each having a size adapted to engage an individual of the first connector means (20) protruding from the first part, the through holes (27) of the second part (21*a–c*) being positioned in the same configuration as the first connector means (20) in the first part (2).

27. A method according to claim 21, characterised by providing the second connector means (29*a–c*) in two different directions.

28. The method according to claim 21 wherein the second housing part is placed on the printed circuit board substantially simultaneously with placement of the second connector means on the printed circuit board.

* * * * *